United States Patent [19]

Tanimoto et al.

[11] Patent Number: 5,399,449
[45] Date of Patent: Mar. 21, 1995

[54] METHOD FOR PRODUCING COLOR FILTER WHEREIN THE VOLTAGE USED TO ELECTRODEPOSIT THE COLORED LAYERS IS DECREASED WITH EACH SUBSEQUENT ELECTRODEPOSITION STEP

[75] Inventors: Junichiro Tanimoto; Haruyoshi Sato; Yutaka Otsuki, all of Yokohama, Japan

[73] Assignee: Nippon Oil Co., Ltd., Tokyo, Japan

[21] Appl. No.: 123,152

[22] Filed: Sep. 2, 1993

[30] Foreign Application Priority Data

Sep. 7, 1992 [JP] Japan ................... 4-238322

[51] Int. Cl.⁶ ................................. G03F 9/00
[52] U.S. Cl. ........................... 430/7; 430/20; 430/293; 430/321; 205/83; 204/181.1; 204/181.6; 204/181.7
[58] Field of Search ............ 430/7, 321, 20, 293; 205/83; 204/181.1, 181.6, 181.7

[56] References Cited

U.S. PATENT DOCUMENTS

| | | | |
|---|---|---|---|
| 4,522,691 | 6/1985 | Suginoya et al. | 204/181.7 |
| 4,999,094 | 3/1991 | Kamamori et al. | 204/181.7 |
| 5,122,247 | 6/1992 | Kokado et al. | 201/181.1 |
| 5,185,074 | 2/1993 | Yokoyama et al. | 204/181.1 |
| 5,186,801 | 2/1993 | Matsumura et al. | 430/7 |
| 5,214,542 | 5/1993 | Yamashita et al. | 430/7 |
| 5,242,558 | 9/1993 | Matsushima et al. | 204/181.1 |

*Primary Examiner*—Charles L. Bowers, Jr.
*Assistant Examiner*—John S. Chu
*Attorney, Agent, or Firm*—Darby & Darby

[57] ABSTRACT

A method for producing a color filter involves (A) forming a photosensitive coating film on at least a transparent electrically conductive layer formed on an outermost surface of a transparent substrate and exposing the photosensitive coating film through a mask having patterns of at least three different degrees of light transmittances; (B) developing and removing a photosensitive coating film region corresponding to one of the patterns of the smallest and largest degrees of light transmittances for exposing the transparent electrically conductive layer and electrodepositing a colored coating on the exposed transparent electrically conductive layer for forming a colored layer thereon. Operation of developing and removing the photosensitive coating film and electrodepositing the colored coating is repeated for the respective patterns of different degrees of light transmittances in sequence of difference in light transmittances to form different colored layers. The electrodepositing is in turn performed at each time in a decreasing voltage.

41 Claims, 2 Drawing Sheets

METHOD FOR PRODUCING COLOR FILTER WHEREIN THE VOLTAGE USED TO ELECTRODEPOSIT THE COLORED LAYERS IS DECREASED WITH EACH SUBSEQUENT ELECTRODEPOSITION STEP

BACKGROUND OF THE INVENTION

This invention relates to a method for producing a color filter and more particularly to a color filter advantageously employed as a color liquid crystal display device.

Among the currently employed methods for preparing a color filter, there are a dyeing method consisting in dyeing a transparent substrate with a binder containing dyes and pigments, a printing method and a pigment dispersion method.

Since the dyeing method consists in selectively forming a thin resin film on a substrate with dyes, a resist printing process and a photolithographic process need to be performed each time the color is changed. Although resist printing is unnecessary with the printing method, there is a limit to the refinement of color patterns and, the larger is the number of colors, the printing position becomes the worse. Although the fine color pattern is possible with the pigment dispersion method, a high precision photolithographic process needs to be performed each time the color is changed, resulting in a complicated process.

For overcoming the deficiency, there is proposed in Japanese Laid-open Patent Application No. 59-114572 (1984) a method for producing a color filter by an electrodeposition coating method. With this method, a transparent electrode is prepared by patterning a transparent electrically conductive film deposited on the substrate, the substrate is immersed in a colored electrodeposition bath for forming a colored layer by electrodeposition, and electrical voltage is applied only to a portion of the patterned transparent electrode which is to be dyed in the same color. The substrate is then immersed in a colored electrodeposition, and bath for forming a different color layer by electrodeposition electric voltage is then applied only to a portion of the substrate which is to be dyed in a different color. However, it is necessary with this method to perform a high precision patterning of the transparent electrode, and to pay meticulous care during the subsequent process not to break the fine pattern, because otherwise the subsequent coloring process is rendered difficult. Besides, the patterned transparent electrode needs to be electrically continuous, even in fine pattern sections, so that limitations are imposed on the degree of freedom of the pattern shape.

In Japanese Laid-open Patent Application No. 63-210901 (1988), there is proposed a method consisting in forming colored layers by light exposure, development and electrodeposition, using a mask having patterns only in areas to be dyed in the same colors and a positive type photosensitive resin composition, and repeating the steps of light exposure, development and electrodeposition a desired number of times. This method is inferior in stability because it makes use of a compound containing unstable quinone diazido groups. Besides, if the quinone diazido compound is brought into contact with an aqueous alkali solution, the quinone diazido compound in the unexposed part is also reacted with an aqueous alkali solution so that photosensitivity is markedly changed to present difficulties in the subsequent right exposure and development steps.

In these electrodeposition methods a transparent electrode for formation of colored layers is simultaneously used as an electrode for driving a liquid crystal. However, since the colored layers formed on the transparent electrode is made of an insulating material, the liquid crystal driving voltage becomes exceedingly high. For this reason, a transparent electrode for driving the liquid crystal is additionally provided on the colored layers formed in accordance with the above method for lowering the driving voltage. On the other hand, since the transparent electrode employed in the above method has a light transmittance of 80 to 85%, provision of two transparent electrode layers leads to lowered light transmittance to deteriorate the performance as a colored display substrate. For overcoming this defect, there is proposed in Japanese Laid-open Patent Application No. 1-22479 (1989) a method comprising forming a colored layer on a master plate and transferring it onto a transparent substrate. However, since the transfer is effected for each color with this prior-art method, it becomes necessary to achieve high precision alignment for each transfer operation, thus complicating the production.

On the other hand, in order to meet the demand for high performance of the device provided with a color filter, it has been desired to improve contrast and to prevent color purity from being lowered. In order to solve this problem, a method of forming a non-light transmitting film in a region of the color filter defined between neighboring pixels has been proposed. For forming the non-light transmitting film, there are known a method comprising forming pixels with alignment on a substrate on which a non-light transmitting film pattern is formed previously, and a method comprising forming a non-light transmitting film pattern with alignment on a substrate on which a pixel pattern is formed previously.

However, since it is necessary with these methods to effect an alignment operation between the pixel pattern and the non-light transmitting pattern, it is difficult with this precision to form a pattern of non-light transmitting pattern of a coincident size free of the light transmitting sections between the pixel patterns. If overlapped portions are produced, step differences are produced on a color filter, so that it becomes difficult to produce a color filter excellent in planarity.

With any of the above methods, high precision processing is required for alignment so that it is difficult to cope with the demand for a larger work size, that is a larger picture size with reduced costs.

In order to solve these disadvantages, a method for electrodepositing in turn each pixel has been proposed in Japanese Patent Application No. 3-43596. However, when black matrixes which light-intercepts the space between each pixel are formed in the same manner as each pixel, since black-hued coating containing carbon black having high light-interception is electrically conductive with a formed coating film, it is difficult to handle the black-hued coating similarly to the other colored coatings. Specifically, if the black-hued coating is formed followed by electrodepositing the other colored coatings, the other colored coatings are electrodeposited not only on the transparent electrically conductive layer but also on the black-hued coating film so that smoothness of the color filter is impaired. On the other hand, a method of electrodepositing a black-hued coating onto pixel free portions after the formation of the other pixels, lacks somewhat in precision to produce a black-hued light-intercepting layer requiring the highest precision.

To overcome these problems, there are proposed a method of using a black-hued coating containing mixed pigments other than carbon black, and a method of applying a photosensitive resin containing a black colorant to the overall surface of a color filter on which pixels other than the black pixel has been formed, subjecting only pixel free portions to light exposure to thereby cure photosensitive resin portions corresponding to the pixel free portions by exposing from the back side, i.e. substrate side to utilize each pixel as a light-intercepting portion, and developing and removing the photosensitive resin portions corresponding to pixel portions to form a black-hued coating film. However, in the former method black concentration is insufficient, while in the latter method the light-interception of each pixel is inherently insufficient so that it is impossible to obtain a satisfactory black-hued light-intercepting layer in either method.

SUMMARY OF THE INVENTION

It is a principal object of the present invention to provide a method for producing a color filter which is not in need of high precision fine processing and which has a large degree of freedom in selecting the pattern contour of the colored layers and non-light transmitting layers can be arrayed without gaps between the color filter pixels.

It is another object of the present invention to provide a method for preparing a color filter which can be adapted easily for larger picture size and which can be mass-produced easily.

It is a further object of the present invention to provide a method for producing a color filter which can lower the driving voltage without light transmission being lowered and which do not require an additional step of forming transparent electrodes.

It is a further object of the present invention to provide a method for producing a color filter having light-intercepting layers patterned with high precision.

The above and other objects of the invention will become apparent from the following description.

The present invention provides a method for producing a color filter comprising the steps of:

(A) forming a photosensitive coating film on at east a transparent electrically conductive layer formed on an outermost surface of a transparent substrate and exposing said photosensitive coating film through a mask having patterns of at least three different degrees of light transmittances;

(B) developing and removing a photosensitive coating film region corresponding to a pattern selected from the group consisting of a pattern having the smallest degree of light transmittance and a pattern having the largest degree of light transmittance for exposing said transparent electrically conductive layer and electrodepositing a colored coating on the exposed transparent electrically conductive layer for forming a colored layer thereon, operation of developing and removing the photosensitive coating film and electrodepositing the colored coating being sequentially repeated for the respective patterns having different degrees of light transmittances where said sequence of repetition is selected from the group consisting of increasing light transmittance and decreasing light transmittance to form different colored layers, respectively, said electrodepositing being in turn performed at each time in a decreasing voltage.

PREFERRED EMBODIMENTS OF THE INVENTION

Figure 1:
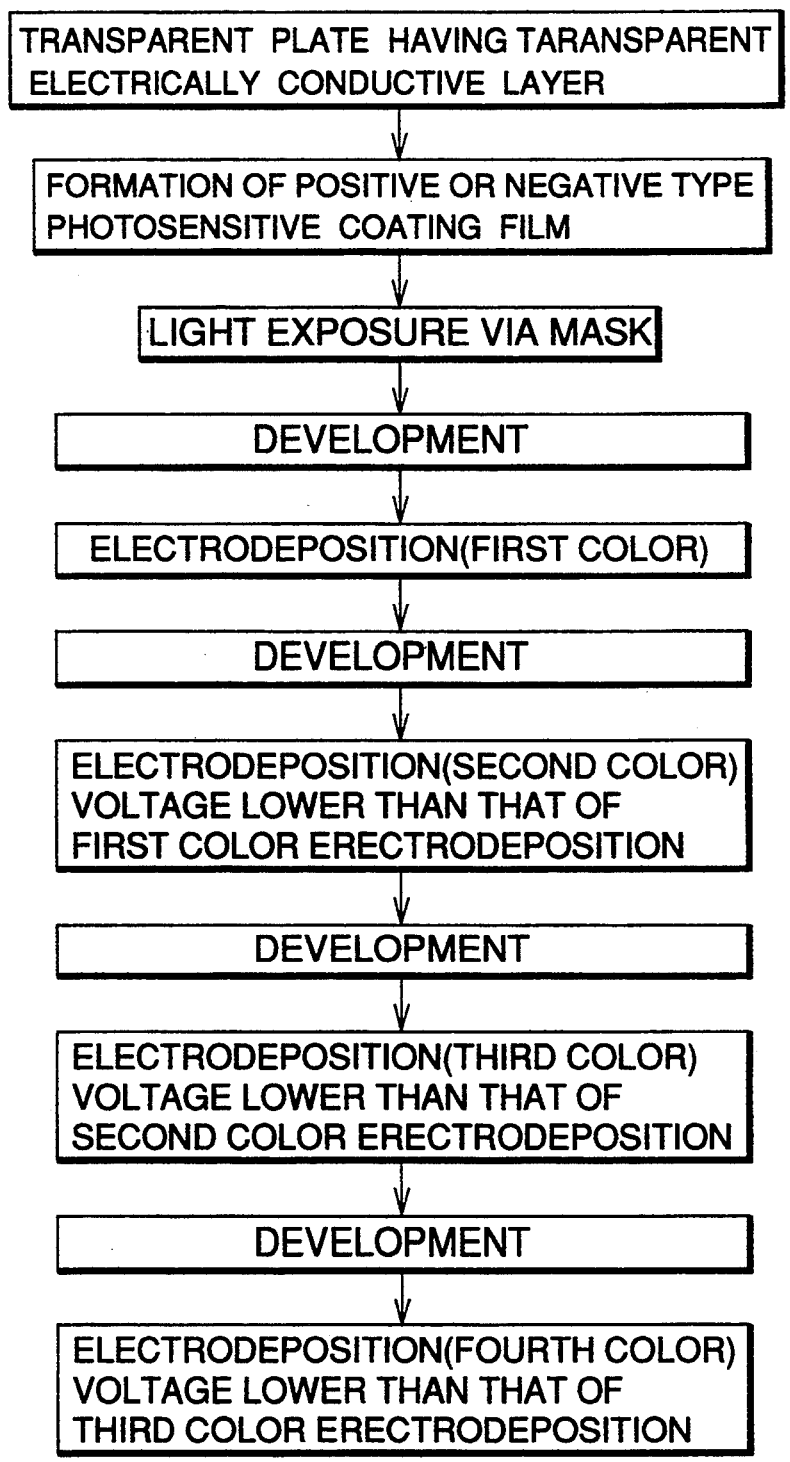
FIG. 1 is a diagram showing step by step a process for producing a color filter according to an embodiment of the present invention.

The present invention will be explained in more detail hereinbelow.

According to the present invention, a photosensitive coating film is formed on at least a transparent electrically conductive layer formed on the outermost surface of a transparent substrate, and light exposure is performed via a mask having patterns of at least three different degrees of light transmittances (the step is referred to hereinafter as step A).

There is no particular limitation to the transparent substrate having a transparent electrically conductive layer on its outermost surface, if the substrate is a transparent plate having an electrically conductive layer on its surface. Examples of the substrate may include a glass plate, a laminated plate, a plastic plate or a plate having a transparent electrically conductive layer and a light intercepting layer on its surface. The substrate preferably has a smooth surface in view of the performance desired of a color filter. The surface of the substrate may be ground if so required.

The electrically conductive layer may be formed of such materials as tin oxide, indium oxide, antimony oxide and mixtures thereof and may have a film thickness of 20 to 300 nm. There is no particular limitation to the methods for forming an electrically conductive layer and any of the known methods such as spraying chemical vapor deposition (CVD), sputtering or vacuum evaporation, may be employed. A commercially available transparent substrate having a transparent electrically conductive layer may be employed. The substrate is preferably of higher transparency in view of the performance desired of the color filter.

Although there is no particular limitation to the method of forming the photosensitive coating film on the transparent electrically conductive layer formed on the transparent substrate, a negative or positive type photosensitive coating may be applied on the substrate by the known methods, such as electrodeposition, spraying, dip coating, roll coating, screen printing or spin coating.

As the negative type photosensitive coating for forming the negative type photosensitive coating film, a negative type photosensitive coating resin exhibiting film forming capabilities and photosensitivity and a photopolymerization initiator may be dispersed or dissolved in a solvent such as an organic solvent or water so as to be used as a coating material. As the positive type photosensitive coating for forming the positive type photosensitive coating film, a positive type photosensitive coating resin exhibiting film coating capabilities and photosensitivity may be dispersed or dissolved in water or in an organic solvent so as to be used as a coating material. Dyes and/or pigments may be contained in the negative or positive type coatings.

The negative type photosensitive coating resin preferably employed in the present invention may include a prepolymer having photosensitive groups such as (meth)acryloyl groups, e.g. acryloyl or methacryloyl group, cinnamoyl groups or mixtures thereof at a terminal and/or side chain of the molecule, an onium group-containing cationic resin or a carboxylic group-containing anionic resin. The negative type photosensitive coating resin may have a molecular weight ranging between 500 and 10,000.

The prepolymer may preferably be formed from epoxy (meth)acrylate, urethane (meth)acrylate, polyester (meth)acrylate, or mixtures thereof.

The onium group-containing cationic resins may be composed of a main resin, such as acrylic resin, polyester resin, maleinated oil resin, polybutadiene resin, epoxy resin, urethane resin, polyamide resin or mixtures thereof, and the photosensitive groups and onium groups, such as amino group, ammonium group, sulfonium group or mixtures thereof, introduced therein. These resins may preferably be neutralized with an acidic susbstance such as formic acid, acetic acid, propionic acid, lactic acid or mixtures thereof, and solubilized and/or dispersed in water.

The carboxyl group-containing anionic resins may be composed of the above mentioned main resin into which carboxylic groups and the aforementioned photosensitive groups are introduced. These resins may preferably be solubilized and/or dispersed in basic substances, such as triethylamine, diethylamine, dimethylethanol amine, ammonia or mixtures thereof.

There is no particular limitation to the positive type photosensitive coating resin, if it is dissolved in a developing solution on light exposure, and may be enumerated by resins including quinone diazido groups, resins including diazomeldrum's acid or nitrobenzyl ester, or resin compositions including these resins. Specific examples of these resins include a quinone diazido group-containing cationic resin in which the onium groups and hydroxyl groups are introduced into the above main resins, to which a quinone diazido sulfonic acid compound is added further by esterification reaction followed by being neutralized with an acidic substance such as formic acid, acetic acid, propionic acid, lactic acid or mixtures thereof and solubilized and/or dispersed in water; a quinone diazido group-containing anionic resin in which carboxyl groups and hydroxyl groups are introduced into the above mentioned main resins, to which a quinone diazido sulfonic acid compound is further added by an esterificiation reaction followed by being neutralized with basic substances e.g. triethylamine, diethylamine, dimethylethanol amine, ammonia or mixtures thereof, and sulubilized and/or dispersed in water; a quinone diazido group-containing resin obtained by reacting a resin having film-forming capability and a hydroxyl group-compound with a quinone diazido compound including a quinone diazido sulfonic acid derivative or an isocyanate group; and resin compositions containing these resins. The mixing ratio for the resin compositions may be optionally selected depending on light exposure and development conditions.

As the negative type photosensitive coating resin and the positive type photosensitive coating resin, prepolymers or resins that may be solubilized and/or dispersed in water are most preferred for simplifying the process and combating the pollution.

The negative type photosensitive coating resins may also be admixed with low molecular (meth)acrylates for controlling photosensitive properties and viscosity of the coating film. Examples of such (meth)acrylates include 2-hydroxyethyl (meth)acrylate, 2-phenoxyethyl (meth)acrylate, 3-phenoxy-2-hydroxypropyl (meth)acrylate, 2-ethylhexyl (meth)acrylate, tricyclodecane (meth)acrylate, hexanediol-di(meth)acrylate, trimethylolpropane triacrylate, pentaerythritol triacrylate, dipentaerythritol hexacrylate, tris(acryloyl oxyethyl) isocyanurate, and mixtures thereof. The proportion of these (meth)acrylates is preferably up to 50 and most preferably up to 30 parts by weight to 100 parts by weight of the negative type photosensitive coating resin. If the proportion of the (meth)acrylates exceeds 50 parts by weight, the coating becomes undesirably tacky.

The photopolymerization initiator employed in the negative type photosensitive coating may be any of those known in the art and may be enumerated by benzoins, benzoin ethers, benzilalkyl ketals, benzophenone derivatives, anthraquinone derivatives, thioxanthone derivatives or mixtures thereof. Sensitizers may be added thereto if so desired. The photopolymerization initiator may be added in an amount of 0.1 to 30 and preferably 0.5 to 20 parts by weight to 100 parts by weight of the negative type photosensitive coating resin. If the amount of the initiator is less than 0.1 part by weight, photocuring properties fall short, whereas, if it exceeds 30 parts by weight, curing proceeds excessively and hence the coating film becomes poor in strength, while economic advantages are also lost.

The organic solvent used for dispersing or dissolving the components of the negative and positive type photosensitive coating resins may be any of those capable of dispersing or dissolving the above mentioned prepolymers or resins. Examples of the solvents include glycol ethers, such as ethyleneglycol monobutyl ether, ethyleneglycol monohexyl ether, ethyleneglycol monophenyl ether, propyleneglycol monomethyl ether, propyleneglycol monophenyl ether, diethyleneglycol dimethyl ether or triethyleneglycol dimethyl ether; ketones such as acetone, methylethyl ketone, methylisobutyl ketone, cyclohexanone or isophorone; ethers such as dibutyl ether, dioxane or tetrahydrofuran; alcohols such as methoxy butanol, diacetone alcohol, butanol or isopropanol; hydrocarbons such as toluene, xylene or hexane; esters such as ethyl acetate, butyl acetate, 2-methoxyethyl acetate, 2-methoxypropyl acetate or ethyl benzoate; acid amides such as dimethyl formamide, N,N-dimethyl acetoamide of dimethyl sulfoxide, and mixtures thereof.

These organic solvents may be added during solubilization or dispersion in water of the above mentioned cationic or anionic resins for improving bath stability or smoothing coating films.

The hue of the dyes and/or pigments mixed with the positive type or negative type photosensitive coating may be selected freely depending on objects, if so desired. For example, in order to improve resolution of the photosensitive coating, it is preferred to incorporate dyes absorbing light having wavelength of 400 to 500 nm such as oil yellow or ultraviolet ray absorber, e.g. trihydroxy benzophenone to remove light having broad wavelength which exhibits large diffraction upon exposure. Two or more dyes and/or pigments may be mixed to obtain desired hue unless their characteristics are impaired.

The dyes and/or the pigments are preferably so selected as not to lower the stability and occasionally electrodeposition properties as well as durability of the coating. For this reason, oil soluble or dispersible dyes, such as azo, anthraquinone, benzodifuranone, condensed methine series dyes, or mixtures thereof, are preferred. The pigments may be exemplified by organic pigments, such as azo lake organic pigments, quinacridone organic pigments, phthalocyanine organic pigments, isoindolinone organic pigments, anthraquinone organic pigments or thioindigo organic pigments; chrome yellow, iron oxide, chrome vermilion, chrome green, ultramarine, prussian blue, cobalt blue, cobalt green, emerald green, titanium white, carbon black or mixtures thereof. As for the color hue of the dyes and pigments, reference is had to "COLOUR INDEX" whenever necessity arises.

The amount of the dyes and/or the pigments is suitably selected depending on the application, color hue, the type of the dyes and/or the pigments or the film thickness of the photosensitive coating. The amount may preferably be 0.1 to 10 wt. % and more preferably 0.5 to 5.0 wt. % based on the total photosensitive coating.

For producing the negative type photosensitive coating, the negative type photosensitive coating resins, the photopolymerization initiator and the solvent are sufficiently dispersed, using a dispersion apparatus, such as customary sand mills, roll mills or attriters. The positive type photosensitive coating may be prepared by mixing and dispersing the resins for the positive type photosensitive coating and the solvent in the same manner as for the negative type coating. The dyes, pigments, acidic or basic substances, dispersants, levelling agents for improving smoothness of the coating film, viscosity adjustment agents or defoaming agents may be mixed and dispersed as needed. There is no limitation to the film thickness of the photosensitive coating films formed by the photosensitive coating and the film thickness may be suitably selected depending on the performance desired of the color filter. The dry film thickness may be usually 0.3 to 20 μm and preferably 1 to 15 μm. The film thickness may be adjusted by controlliing, for example electrodeposition conditions, such as voltage, electrodeposition time and bath temperature. However, film thickness adjustment may be usually made under the same conditions as those for electrodeposition coating of colored coatings, as will be explained subsequently. In case where the negative type photosensitive coating film is used, the film thickness may usually be as thick as approximately 5 to 15 μm or may be formed to have a thickness of approximately 0.3 to 10 μm followed by forming an oxygen-barrier film such as polyvinyl alcohol to reduce hardening prevention action due to oxygen and to prevent contamination of the mask or formation of pinholes.

According to the present invention, exposure of the photosensitive coating film is to be performed by using a mask having patterns of at least three different degrees of light transmittances. The light transmittance means an intensity ratio before and after transmission of the exposure light through the mask. At least three different light transmittance degrees of the mask patterns will suffice depending on the number of types of the colored coatings. The difference in the light transmittance degrees may be optionally determined depending on the conditions of light exposure and development. In general, the larger the relative difference in the respective light transmittances, the easier becomes the adjustment of light exposure time, which is more desirable. However, even if the difference in the light transmittances is small, the same objective may be achieved by enhancing the volume of light exposure or prolonging the light exposure time. Thus, a significant difference of 5% or more is desirable, although no imitations are placed on the relative difference in the light transmittances.

Light exposure may be usually achieved using a system radiating a large quantity of ultraviolet rays. For example, a high pressure mercury lamp, an ultra high pressure mercury lamp or a metal halide lamp may be used as a light source. If necessary, other radiation rays may also be employed. Light exposure conditions may be selected suitably depending on photosensitive coatings employed, light exposure devices and masks.

In the step A of the present invention, by effecting light exposure through a mask having patterns of at least three different degrees of light transmittances, a number of different exposure states which is the same as that of the different light transmittance degrees of the patterns may be provided in the photosensitive coating film.

In the method of the present invention, the step of forming a colored layer by applying a colored coating by electrodeposition on the transparent electrically conductive layer exposed after developing and removing the photosensitive coating film is repeated, next to the step A, in the order of the increasing light transmittance degrees of the patterns with use of the negative type photosensitive coating and in the order of the decreasing light transmittance degrees of the patterns with use of the positive type photosensitive coating, for producing the respective colored layers. That is, if the negative type photosensitive coating is employed, the portion of the photosensitive coating film corresponding to a pattern of the smallest degree of light transmittance of the patterns is selectively developed and removed, and the colored coating is electrodeposited on the exposed transparent electrically conductive layer to form a colored layer (step B). The portion of the coating film corresponding to the second smallest light transmittance degree of the patterns is then selectively developed and removed and the colored coating is electrodeposited on the exposed electrically conductive layer to form a colored layer. This sequence of operations is repeated to produce the colored layers, respectively (step B). If the positive type photosensitive coating is employed, the portion of the photosensitive coating film corresponding to a pattern of the largest light transmittance of the mask is selectively developed and removed and a colored coating is electrodeposited on the exposed transparent electrically conductive layer to form a colored layer (step B). The portion of the coating film corresponding to the second largest light transmittance degree of the patterns is then selectively developed and removed and a colored coating is electrodeposited on the exposed electrically conductive layer to form a colored layer. This sequence is repeated to produce the respective colored layers (step B).

According to the method of the present invention, every time when the step B is repeated, the electrical voltage in each step B is decreased.

The conditions for selectively developing and removing the photosensitive coating film may be changed depending on the volume of light exposure, solubility of the photosensitive coating in the developing solution, the types and the concentrations of the developing solution, development time and temperatures. Thus, the conditions may be suitably selected for the resin used for the preparation of the photosensitive coating. Specifically, aqueous solutions containing dissolved acidic materials may be used as a developing solution when the cationic resin is used as a component of the negative photosensitive coating. The acidic materials include organic acids, such as formic acid, acetic acid, propionic acid or lactic acid; inorganic acids, such as hydrochloric acid or phosphoric acid; and mixtures thereof. If lactic acid is used as a developing solution, it may be used at a concentration usually of 0.01 to 50 wt. % and preferably 0.05 to 25 wt. %. The developing temperature is usually 10° to 70° C. and preferably 15° to 50° C. and the developing time is usually 2 to 600 seconds, preferably 30 to 300 seconds. As a developing solution in case of employing an anionic resin as a component of the negative type photosensitive coating and as a developing solution for the positive type photosensitive coating, an aqueous solution containing basic substances dissolved therein, may be employed. The basic substances may include sodium carbonate, sodium hydrogen carbonate, sodium metasilicate, tetraalkyl ammonium hydroxide, sodium hydroxide, potassium hydroxide and mixtures thereof. If an aqueous solution of sodium carbonate is used as a developing solution, sodium carbonate may be used in a concentration range of 0.01 to 25 wt. % and preferably 0.05 to 20 wt. % for development. The development time usually is selected within a range of 2 to 600 and preferably 30 to 300 seconds generally at 10° to 70° C., preferably 15° to 50° C. A developing solution when the positive type photosensitive coating is employed may usually be an aqueous solution in which a basic material is dissolved. The basic material includes sodium carbonate, sodium hydrogen carbonate, sodium metasilicate, tetraalkyl ammonium hydroxide, sodium hydroxide, potassium hydroxide and mixtures thereof. For example, where an aqueous solution of sodium metasilicate is employed as a developing solution, development may be effected at the concentration of sodium metasilicate of 0.01 to 25 wt. % and preferably 0.05 to 20 wt. %. The developing temprature may usually be 10° to 70° C. and preferably be 15° to 50° C. and the developing time may be 2 to 600 seconds and preferably 30 to 300 seconds. For the developing solutions, organic solvents such as alcohols, glycol ethers, ketones, chlorinated hydrocarbons or mixtures thereof, may be employed. Surfactants or defoaming agents may also be added to these developing solutions for improving wettability or anti-foaming properties. Aqueous developing solutions are preferably employed in view of non-toxicity and sanitation in working environments.

Where the oxygen-barrier film is formed on the negative type photosensitive coating film, the oxygen-barrier film should be removed in advance of the aforementioned development. The removal of the oxygen-barrier film may be effected in any way depending upon the kinds of the films used. For example, if polyvinyl alcohol is used for forming the film, deionized water or an aqueous solution in which a surface active agent is added to deionized water may be employed as a removing agent. To effect the removal promptly, the removing agent may be heated to 30° to 60° C.

After the development, colored coatings are electrodeposited on the exposed transparent electrically conductive layer for forming a colored layer. It is much preferred that a black coating be formed in the first coloring step since the precision of the black-hued light-intercepting layer requiring the highest precision is easily enhanced.

In preparing the colored coating, cationic resins or anionic resins or photocurable resins are used as a film-forming component, and dyes and/or pigments are added as a colorant component. Acidic or basic substances may also be employed for dissolving and/or dispersing these components in water. Organic solvents may be added for facilitating dissolution and/or dispersion of the resins in the colored coating for improving bath stability or for producing smooth coating films. If the positive type photosensitive coating film is used in step A, a cationic resin is preferably used for preparation of the colored coating used in step B. On the other hand, if the negative type photosensitive coating film used in step A is composed of a cationic resin, an anionic resin is preferably used for preparation of the colored coating used in step B, whereas if the negative type photosensitive coating film used in step A is composed of an anionic resin, a cationic resin is preferably used for preparation of the colored coating employed in step B although not limited to such combinations.

The cationic resins may for example be resins composed of the main resins used in the photosensitive coating into which onium groups such as ammonium, sulfonium groups or amino groups are introduced, such as resins solubilized or dispersed in water with an acidic substance, such as formic acid, acetic acid, propionic acid, lactic acid or mixtures thereof.

The anionic resins may for example be resins composed of the main resins used in the photosensitive coating into which carboxyl groups, etc. are introduced, and may for example be resins solubilized or dispersed in water with basic substances such as triethylamine, diethylamine, dimethylethanol amine, ammonia or mixtures thereof.

As the photocurable resins, those prepolymers or resins containing acryloyl groups, methacryloyl groups, cinnamoyl groups or mixtures thereof, that are used in the photosensitive coating film in the step A and that are suited for electrodeposition, may be employed. The above mentioned photopolymerization initiators may also be employed in combination. Resin components for preparation of the colored coating may include highly thermosetting electrodeposition resins such as a mixed resin of acrylic resin and a melamine resin.

The colored coatings employed in step B may be different in type, color hue, color concentration or color brightness in the regions exhibiting different light transmittances. Alternatively, the same colored coatings may be used in common for these regions.

The color hue of the colored coating may be selected depending on the objects. For example, the colored coatings having different color hue may be employed for the photosensitive coating used in the step A, the colored coating used in step B and the plural colored coatings used in step B, respectively.

In the preparation of the colored coatings, resins, dyes and/or pigments, acidic or basic substances, organic solvents, dispersants for the dyes or pigments, levelling agents for improving smoothness of the coating films, viscosity controlling agents or anti-foaming agents are mixed together and dispersed sufficiently in a conventional dispersion device such as sand mill, roll mill or attriter. The resulting dispersion is diluted in water to a predetermined concentration of about 4 to 25 wt. % and preferably to 7 to 20 wt. % of solid content to produce a coating suitable for electrodeposition. The so-produced coating may be applied on the electrically conductive layer by electrodeposition for providing a colored layer.

There is no particular limitation to the film thickness of the colored layer, which may be suitably selected depending on the performance required of a color filter. However, the dry thickness is usually 0.3 to 5 $\mu$m and preferably 1 to 3 $\mu$m.

Although the conditions of electrodeposition may be suitably selected depending on the types of the colored coatings and film thickness of the colored coating films, the electrical voltage is usually 5 to 500 V dc and preferably 10 to 300 V dc, the electrodeposition time is usually 5 to 300 sec and preferably 10 to 200 sec and the liquid temperature is usually 10° to 35° C. and preferably 15° to 30° C. After lapse of the electrodeposition time sufficient to produce a desired film thickness, current conduction is discontinued and the substrate is taken out of the bath. The substrate is freed of excess bath liquid by washing with water and dried to produce the colored layer.

According to the invention, to prevent color mixing of the already formed colored coating or coatings with a colored coating to be now deposited, the electrical voltage to be applied next is made lower than that applied immediately before. The voltage of electrodeposition may preferably be 40 to 98%, most preferably 50 to 95% that of the electrodeposition of the colored layer formed immediately before. If a black-hued layer is first electrodeposited, the voltage at the second and subsequent electrodeposition may preferably be about 40 to 80%, preferably about 40 to 70% that of the first electrodeposition. The sweep time until setting the voltage may preferably be 2 seconds or more, more preferably 10 to 20 seconds.

Although the drying conditions may be selected suitably depending on the conditions of the subsequent process steps, it is usually preferred that the conditions be such that surface moisture is dried, for example, the drying time be of the order of 0.5 to 60 minutes and preferably 5 to 30 minutes at a temperature of 150° C. or lower and preferably 60° to 120° C. If the drying temperature is higher than 150° C., the photosensitive coating film is occasionally cured under heat to raise difficulties in the subsequent development process.

Although the desired color filter may be produced by the above described steps (A) and (B), heating, curing or photocuring may be effected, if needed, for further improving weatherability or resistance to chemicals. If heating or curing is effected, the temperature is usually 100° to 250° C. and preferably 150° to 250° C. and the processing time is usually 5 minutes to one hour and preferably 15 to 40 minutes.

The process according to an embodiment of the present invention will be hereinafter explained by referring to FIGS. 1 to 3. It should be noted that the present invention is not limited to this merely illustrative embodiment.

Figure 2:
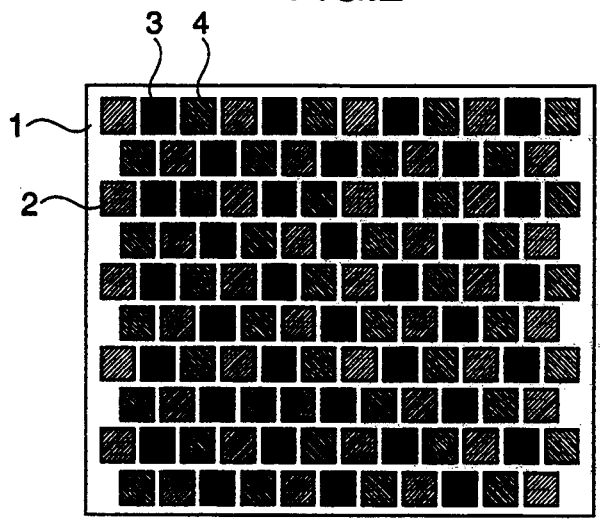
FIG. 2 is an enlarged schematic view showing a positive mask employed in Examples 1 and 2 of the invention.
Figure 3:
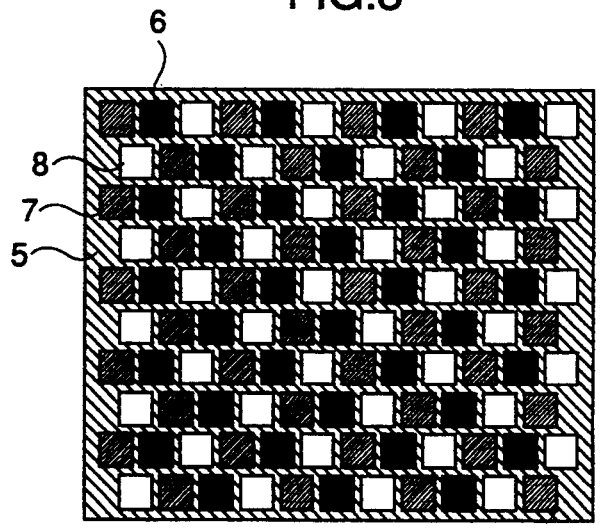
FIG. 3 is an enlarged schematic view showing a negative mask employed in Examples 3 and 4 of the present invention.

FIG. 1 shows one embodiment of the present process step by step and FIG. 2 shows, in an anlarged schematic view, a mask having four different degrees of light transmittances according to an embodiment of the present invention, wherein 1 is a mask region having a 100% light transmittance corresponding to a first color region, 2 is a mask region having a 80% light transmittance corresponding to a second color region, 3 is a 25% light transmittance mask region corresponding to a third color region and 4 is a light transmittance mask region corresponding to a fourth color region. FIG. 3 shows, in an enlarged schematic view, a mask having four different degrees of light transmittances according to an embodiment of the present invention, wherein 5 is a mask region having a 0% light transmittance corresponding to a first color region, 6 is a mask region having a 25% light transmittance corresponding to a second color region, 7 is a 80% light transmittance mask region corresponding to a third color region and 8 is a 100% light transmittance mask region corresponding to a fourth color region.

First, a positive type photosensitive coating film is formed on a transparent electrically conductive layer formed on the surface of a transparent substrate, and the substrate is then dried. After light exposure through a mask shown in FIG. 2, a first developing operation is carried out for exposing or laying to outside a region of the electrically conductive layer which is in register with the 100% light transmittance mask region and which corresponds to the first color region. The substrate is then subjected to electrodeposition coating in an electrodeposition bath containing a first colored coating followed by washing with water and drying by heating.

A second developing operation is then carried out under conditions different from those of the first developing operation for exposing or laying to outside a region of the electrically conductive layer which is in register with the 80% light transmittance mask region and which corresponds to the second color region. The substrate is then subjected to electrodeposition coating at a voltage lower than the first electrodeposition in an electrodeposition bath containing a second colored coating followed by washing with water and drying by heating.

A third developing operation is then carried out under conditions different from those of the first or second developing operations for exposing or laying to outside a region of the electrically conductive layer which is in rgister with the 25% light transmittance mask region and which corresponds to the third color region. The substrate is then subjected to electrodeposition coating at a voltage lower than the first and second electrodeposition in an electrodepositing bath containing a third colored coating followed by washing with water and drying by heating.

A fourth developing operation is then carried out under conditions different From those of the first to third developing operations for exposing or laying to outside a region of the electrically conductive layer which is in register with the 5% transmittance mask region and which corresponds to the fourth color region. The substrate is then subjected to electrodeposition coating at a voltage lower than the first and third electrodeposition in an electrodepositing bath containing a fourth colored coating Followed by washing with water and drying by heating to produce a color filter of the present invention.

With the present method for producing a color filter, patterning may be achieved by one light exposure operation with an increased degree of freedom in the patterned shapes of the colored layers without the necessity of highly advanced fine processing techniques while increased color filter size can be coped with. Thus, the color filter may be mass-produced relatively easily. Besides, according to the present invention a color filter having a highly precision light-intercepting layer can be produced.

EXAMPLES OF THE INVENTION

The present invention will be explained hereinbelow with reference to Synthesis Examples and Examples which are given only for illustration and are not intended for limiting the invention. In these examples, parts are shown in terms of parts by weight.

SYNTHESIS EXAMPLE 1

Synthesis of Cationic Positive Type Photosensitive Coating (X-1)

Synthesis of Unsaturated Compound (x-1)

148 parts of glycidol, 0.8 part of dibutyl tin dilaurylate, 0.2 part of hydroquinone monomethyl ether and 82 parts of 2-ethoxyethyl acetate were charged into a 1-lit separable flask fitted with a thermometer, an agitator, a reflux cooling tube, a gas inlet pipe and a dropping funnel, and the temperature was raised to 50° C. 319 parts of methacryloyloxyethyl isocyanate were added dropwise over an hour as air was blown into the system and reaction was carried out until absorption of the isocyanate groups in IR absorption spectrum substantially disappeared. 276 parts of 4-hydroxybenzoic acid were added, and the temperature was raised to 110° C. After it was confirmed that the acid value was not more than 5 and the epoxide equivalent weight was not less than 11,000, the reaction was discontinued to produce an unsaturated compound (x-1).

Synthesis of Cationic Positive Type Photosensitive Resin (x-2)

238 parts of diethyleneglycol monoethyl ether were charged into a 1-lit separable flask fitted with a thermometer, an agitator, a reflux cooling tube and a dropping funnel, and the temperature was raised to 130° C. Into this mixture, a mixed solution composed of 145 parts of (x-1), 83 parts of isobutyl methacrylate, 167 parts of ethyl acrylate, 78 parts of ethyl methacrylate, 41 parts of dimethylaminoethyl methacrylate and 12 parts of t-butyperoxy-2-ethyl hexanoate were added dropwise over three hours. After lapse of 30 minutes, a mixed solution of 25 parts of diethylene glycol monoethyl ether and 2 parts of t-butylperoxy-2-ethyl hexanoate was added dropwise over 30 minutes. The resulting mixture was maintained at this temperature for two hours to terminate the reaction. 500 parts of the produced acrylic resin solution were taken into a 3-lit separable flask fitted with a thermometer, an agitator, a reflux cooling tube, a nitrogen inlet pipe and a dropping funnel. Into this mixture 1570 parts of acetone and 60.1 parts of 1,2-naphthoquinonediazido-5-sulfonyl chloride were added, and the resulting mixture was agitated throughly at room temperature. Into the resulting mixture, 26.7 parts of triethylamine were added dropwise over an hour, and reaction was continued for further two hours. The produced solution was filtered to remove impurities. The resulting mixture was added dropwise over about one hour into a 20-fold quantity of well-agitated water and precipitated resins were recovered. After removal of the moisture under reduced pressure, a brownish cationic positive type photosensitive resin (x-2) was produced.

Synthesis of Cationic Positive Type Photosensitive Coating (X-1)

500 g of a cationic positive type photosensitive resin (x-2) were dissolved in 333.3 g of methyl ethyl ketone. 11.7 g of acetic acid were added as a neutralizer and the resulting mixture was agitated sufficiently and homogenized. As deionized water was added gradually, the resulting mixture was agitated vigorously by a high-speed mixer to effect dispersion in water to prepare an aqueous solution (X-1) of a cationic positive type photosensitive coating (cationic electrodeposition type).

SYNTHESIS EXAMPLE 2

Synthesis of Anionic Positive Type Photosensitive Coating (X-2)

Synthesis of Anionic Resin (x-3)

1,000 g of "NISSEKI POLYBUTADIENE B-1000" (manufactured by NIPPON PETROCHEMICALS CO., LTD.; number average molecular weight, 1,000; iodine value, 430; content of 1,2-linkage, 65%), 751 g of maleic anhydride, 10 g of xylene and 5.0 g of trimethylhydroquinone, were charged into a 3-lit separable flask fitted with a thermometer, an agitator, a reflux cooling tube and a nitrogen blowing pipe, and reaction was carried out at 190° C. for 5 hours under nitrogen. After non-reacted maleic anhydride and xylene were distilled off, maleinated polybutadiene with a total acid value of 480 mg KOH/g was produced.

Then, 500 g of the maleinated polybutadiene, 218 g of phenoxyethanol and 205 g of diethyleneglycol dimethyl ether were charged into a 2-lit separable flask fitted with a reflux cooling tube, and dissolved homogeneously. Reaction was then carried out under nitrogen at 130° C. for three hours. Then, 61 g of benzylamine were added dropwise for 30 minutes at the same temperature and the temperature was raised to 165° C. Reaction was carried out at this temperature for seven hours to produce a solution of an anionic resin (x-3) containing hemi-ester and imide groups.

Synthesis of Photosensitive Resin (X-4)

1000 g of "NISSEKI POLYBUTADIENE B-1000" (manufactures by NIPPON PETROCHEMICALS CO., LTD.; number average molecular weight, 1,000; iodine value, 430; content of 1,2-linkage, 65%), 388 g of maleic anhydride, 10 g of xylene and 3.0 g of trimethyl hydroquinone were charged into a 3-lit separable flask fitted with a thermometer, an agitator, a reflux cooling tube and a nitrogen blowing pipe, and reaction was carried out at 190° C. for 5 hours under nitrogen. After non-reacted maleic anhydride and xylene were distilled off, maleinated polybutadiene with a total acid value of 320 mg KOH/g was produced.

Then, 500 g of the maleinated polybutadiene and 300 g of phenoxyethanol were charged into a 2-lit separable flask fitted with a thermometer, an agitator, a reflux cooling tube and a nitrogen blowing tube and dissolved homogeneously. Reaction was then carried out under nitrogen at 130° C. for three hours. After cooling to room temperature, 149 g of 2-(2-aminoethylamino)ethanol were added dropwise over an hour. The temperature was then raised to 125° C., at which temperature the reaction was carried out for four hours to produce a solution of polyamine resin containing imido groups.

Into a 5-lit separable flask fitted with a reflux cooling tube were charged 269 g of 1,2-naphthoquinoneazidosulfonyl chloride, 1900 g of dioxane and 300 g of "KYOWARD 1000" manufactured by KYOUWA CHEMICAL INDUSTRY CO., LTD. Then, 645 g of the polyamine resin solution were added dropwise at 30° C. over two hours and reaction was carried out at this temperature further for five hours. After the produced solution was filtered, 440 g of phenoxy ethanol was added and dioxane was removed under reduced pressure to produce a photosensitive resin (x-4).

The produced resin (x-4) in solution contained 150 mg equivalent of naphthoquinone diazido groups per 100 g of resin, and the non-volatile content amounted to 60.0 wt. %.

Synthesis of Anionic Positive Type Photosensitive Resin (x-5)

750 g of the (x-3) resin solution and 670 g of the (x-4) photosensitive resin were mixed thoroughly followed by adding 60 g of triethylamine for sufficient neutralization to produce an anionic positive type photosensitive resin (x-5) in solution.

Synthesis of Anionic Positive Type Photosensitive Coating (X-2)

Deionized water was added gradually to 500 g of a solution of an anionic positive type photosensitive resin (x-5) and the resulting mixture was agitated vigorously with a high-speed mixer to effect dispersion in water for preparing an aqueous solution of an anionic positive type photosensitive coating (X-2) (an anionic electrodeposition type.)

SYNTHESIS EXAMPLE 3

Synthesis of Cationic Negative Type Photosensitive Coating (X-3)

Synthesis of Amine-added Expoxidated Polybutadiene (x-6)

1,000 g of epoxidated liquid polybutadiene (manufactured by NIPPON PETROCHEMICALS CO., LTD. under the trade name of "E-1000-8", with a number average molecular weight of 1,000 and an oxirane oxygen content of 8%), were charged into a 2 lit separable flask, fitted with a thermometer, a stirrer and a reflux cooling pipe. After replacing the atmosphere within the system by nitrogen, 231.2 g of methylethanolamine were added and reaction was carried out at 170° C. for five hours. Non-reacted methylethanolamine was then distilled off under reduced pressure to produce amine-added epoxidated polybutadiene (x-6) with an amine value of 230.4 mmol/100 g.

Synthesis of Unsaturated Groups-Containing Isocyanate Compound (x-7)

435.5 g of 2,4-tolylene diisocyanate and 266.1 g of diethylene glycol dimethyl ether were charged into a 2-lit round-bottom flask, which might be heated and cooled and which was fitted with a thermometer, a stirrer, a reflux cooling pipe and a dropping funnel. After heating to 40° C., 362.8 g of 2-hydroxyethyl acrylate were added dropwise from the dropping funnel. 200 ppm of p-benzoquinone was also added at this time. Since some heat was evolved due to dropwise addition of 2-hydroxyethyl acrylate, the system was occasionally cooled for maintaining the constant temperature. After the end of the dropwise addition of 2-hydroxyethyl acrylate, the temperature was raised to 70° C., at which temperature the reaction was carried out for three hours. After the IR absorption spectral analyses revealed that the absorption intensity of the isocyanate groups was decreased to about one half that before start of the reaction, the reaction system was cooled to produce an unsaturated group-containing isocyanate compound (x-7).

Synthesis of Cationic Resin (x-8)

500 g of (x-6) were dissolved in 166.7 g of diethylene glycol dimethyl ether in a 2 lit separable flask. 713.4 g of (x-7), in which isocyanate groups are contained in an amount of 0.8 equivalent to 1 equivalent of hydroxyl groups in (x-6), were added dropwise at 40° C., at which temperature the reaction was carried out for one hour. The IR absorption spectral analyses indicated that the isocyanate groups had disappeared. A cationic resin (x-8), in which (x-7) was added to (x-6), was produced.

Synthesis of Cationic Negative Type Photosensitive Coating (x-3)

To 500 g of the cationic resin (x-8) were added 27.0 g of "IRGACURE 907" (manufactured by CIBA-GEIGY INC.), 3.0 g of "KAYACURE DETX" (manufactured by NIPPON KAYAKU CO. LTD.), as photopolymerization initiators, and 37.5 g of "CARBON BLACK #5B" (produced by MITSUBISHI KASEI CORPORATION) under agitation, and 16.7 g of acetic acid were added to the resulting mass as a neutralizer. The resulting mixture was agitated thoroughly and re-homogenized. Deionized water was added gradually to the homogenized mass and the resulting mixture was agitated vigorously by a high-speed mixer to effect dispersion in water to prepare an aqueous solution of the cationic negative type photosensitive coating (X-3) (the cationic electrodeposition type).

SYNTHESIS EXAMPLE 4

Synthesis of Anionic Negative Type Photosensitive Coating X-4)

Synthesis of Hemi-Ester Product (x-9) solution 1,000 g of "NISSEKI POLYBUTADIENE B-1000" (trade name of a product manufactured by NIPPON PETROCHEMICALS CO., LTD., with a number average molecular weight of 1,000, an iodine value of 430, and 1,2-linkage of 65 percent), 554 g of maleic anhydride, 10 g of xylene and 3.0 g of trimethylhydroquinone were charged into a 3 lit separable flask, fitted with a thermometer, a stirrer, a reflux cooling pipe and a nitrogen blowing tube, and reaction was carried out under nitrogen at 190° C. for five hours. After non-reacted maleic anhydride and xylene were distilled off, maleinated polybutadiene with a total acid value of 400 mg KOH/g was produced.

Then, 400 g of the maleinated polybutadiene and 188.5 g of diethyleneglycol dimethyl ether and 0.4 g of hydroquinone were charged into a 2-lit flask fitted with a reflux cooling tube and the temperature was raised to 80° C. After the mixture was dissolved uniformly, 165.6 g of 2-hydroxyethyl acrylate and 20 g of triethylamine were added and reaction was carried out at 80° C. for two hours to produce a hemi-esterified product (x-9) in solution. The total acid value of the produced hemi-esterified product (x-9) in solution was 105 mg KOH/g and the non-voltile content amounted to 75.0 wt. %.

Synthesis of Anionic Negative Type Photosensitive Coating (X-4)

To 500 g of the produced solution of the hemi-ester (x-9) were added 27.0 g of "IRGACURE 907" (manufactured by CIBA GEIGY INC., 3.0 g of "KAYACURE DETX", manufactured by NIPPON KAYAKU CO. LTD.), as photopolymerization initiators and 37.5 g of "CARBON BLACK #5B" (produced by MITSUBISHI KASEI CORPORATION) under agitation. To the resulting mass were added 33.7 g of triethylamine as a neutralizer and the resulting mass was agitated thoroughly and re-homogenized. Deionized water was added gradually to the resulting mass and the resulting mixture was agitated vigorously with a high-speed mixture to effect dispersion in water to prepare an aqueous solution of an anionic negative type photosensitive coating (X-4) (anionic electrodeposition type).

SYNTHESIS EXAMPLE 5

Preparation of Colored Coatings (Y-1, Y-2 and Y-3)

A solution of the cationic resin (x-8), a photopolymerization initiator and pigments were mixed under agitation and dispersed by a laboratory type three-roll roll mill (produced by KODAIRA SEISAKUSHO KK) until the pigment reached a particle size of 0.2 μm or less. The particle size was measured using a COULTER counter N4 (produced by COULTER INC). To each resulting dispersion mixture was added acetic acid as a neutralizer and each of the mixtures was agitated thoroughly for re-homogenization. Each of the resulting masses was dispersed in water under gradual addition of deionized water and under agitation vigorously with a high-speed mixer, to produce each colored coating (Y-1, Y-2 and Y-3) having a solid concentration of 10 wt. %. The compositions of the aqueous solutions of the three-color colored coatings (cationic electrodeposition type) are shown in Table 1. (In Table 1 the numerical figures denote parts by weight).

TABLE 1

|  | Coating No. | | |
|---|---|---|---|
|  | Y-1 | Y-2 | Y-3 |
|  |  | Color |  |
|  | Red | Green | Blue |
| Cationic resin (x-8) solution | 213.3 | 213.3 | 213.3 |
| IRGACURE 907 (*) | 11.5 | 11.5 | 11.5 |
| KAYACURE DETX (**) | 1.3 | 1.3 | 1.3 |
| Acetic acid (Neutralizer) | 19.8 | 19.8 | 19.8 |
| Phthalocyanine Blue (***) | — | — | 20 |
| Phthalocyanine Green (****) | — | 20 | — |
| Azo Metal Salt Red Pigment (*****) | 20 | — | — |

(*) "IRGACURE 907" mfd. by CIBA-GEIGY INC.
(**) "KAYACURE DETX" mfd. by NIPPON KAYAKU CO., LTD.)
(***) Phthalocyanine Blue "SR-150C" (mfd. by SANYO SHIKISO KK)
(****) Phthalocyanine Green "SAX" (mfd. by SANYO SHIKISO KK)
(*****) "PIGMENT RED 4BS" (mfd. by SANYO SHIKISO KK)

SYNTHESIS EXAMPLE 6

Preparation of Colored Coatings (Y-4, Y-5 and Y-6)

The solution of the hemi-ester (x-9) and a pigment were mixed under agitation and dispersed by a laboratory type three-roll roll mill (manufactured by KODAIRA SEISAKUSHO KK), until the pigment particle size of 0.2 μm or less was reached. The particle size was measured using a COULTER counter N4 (manufactured by COULTER INC). To each resulting dispersion mixture was added triethylamine as a neutralizer and the resulting mixture was agitated sufficiently and re-homogenized. Deionized water was added gradually and each resulting mixture was agitated vigorously by a high-speed mixer to effect dispersion in water to prepare each of colored coatings (Y-4, Y-5 and Y-6) having a solid concentration of 10 wt. %. The compositions of the aqueous solutions of the three-color colored coatings of the anionic electrodeposition type are shown in Table 2. (In Table 2, the numerical values in Table 2 represent parts by weight).

TABLE 2

|  | Coating No. | | |
|---|---|---|---|
|  | Y-4 | Y-5 | Y-6 |
|  |  | Color |  |
|  | Red | Green | Blue |
| Hemi-Ester Product (x-9) Solution | 213.3 | 213.3 | 213.3 |
| Triethylamine (Neutralizer) | 21.0 | 21.0 | 21.0 |
| Phthalocyanine Blue (*) | — | — | 20 |
| Phthalocyanine Green (**) | — | 20 | — |
| Azo Metal Salt Red Pigment (***) | 20 | — | — |

(*) "SR-150C" manufactured by SANYO SHIKISO KK
(**) "SAX" manufactured by SANYO SHIKISO KK
(***) "Pigment Red 4BS" manufactured by SANYO SHIKISO

SYNTHESIS EXAMPLE 7

Preparation of Colored Coating (Y-7)

To 500 g of a solution of the cationic resin (x-8) were added 27.0 g of "IRGACURE 907" (produced by CIBA GEIGY INC.) as a photopolymerization initiator, 3.0 g of "KAYACURE DETX" (produced by NIPPON KAYAKU CO., LTD.), and 37.5 g of "CARBON BLACK #5B" (produced by MITSUBISHI KASEI CORPORATION), under agitation and the resulting mass was dispersed by a laboratory three-roll roll mill (produced by KODAIRA SEISAKUSHO KK), until the carbon black reached a particle size of 0.2 μm or less. The particle size was measured using a COULTER counter N4 (produced by a COULTER INC.). To the resulting dispersion mixture were added 16.7 g of acetic acid as a neutralizer and agitated thoroughly for re-homogenization. The resulting mixture was dispersed in water under gradual addition of deionized water and agitated vigorously by a high-speed mixer to produce a black-hued coating material (Y-7) (cationic electrodeposition type) having a solid concentration of 15 wt. %.

SYNTHESIS EXAMPLE 8

Preparation of Black-hued Coating (Y-8)

To 500 g of a solution of the hemi-ester (x-9) were added, under agitation, 27.0 g of "IRGACURE 907" produced by CIBA GEIGY INC. as a photopolymerization initiator, 3.0 g of "KAYACURE DETX", produced by NIPPON KAYAKU CO., LTD. and 37.5 g of "CARBON BLACK #5B" for mixing and the resulting mixture was dispersed by a laboratory three-roll roll mill, produced by KODAIRA SEISAKUSHO KK until the carbon black reached the particle size of 0.2 μm or less. The particle size was measured using a COULTER counter N4 produced by COULTER INC. To the resulting dispersion mixture were added 33.7 g of triethylamine as a neutralizer and agitated thoroughly for re-homogenization. The resulting mixture was agitated vigorously by a high-speed mixer under gradual addition of deionized water for dispersion in water to produce a colored coating (Y-8) having a solid concentration of 15 wt. %.

SYNTHESIS EXAMPLE 9

Preparation of black-Hued coating (Y-9) and Colored Coatings (Y-10, Y-11 and Y-12)

An acrylic resin available under the trade name "ARON S-4030" from TOAGOSEI CHEMICAL INDUSTRY CO., LTD. was neutralized with triethyl amine to give a solution of pH 8, to which deionized water was added to prepare a resin aqueous solution (S).

Carbon black, azo metal salt red pigment, phthalocyanine green, and phthalocyanine blue were added under agitation to the resin solution (S), respectively to give pigment despersions of black-hue, red-hue, green-hue and blue-hue.

Separately, a mixture of a melamine resin (tradename "SUMIMAL M-66B" manufactured by SUMITOMO CHEMICAL CO., LTD.) with the aforementioned acrylic resin was neutralized with triethyl amine to have pH 8, to which deionized water was added to prepare a resin solution (T).

By adding the resin solution (T) to each of the pigment dispersions, a black-hued coating (Y-9) and colored coatings (Y-10, Y-11, and Y-12) were obtained, which were of thermosetting type and of anionic electrodeposition type.

The compositions are shown in Table 3.

TABLE 3

| | (Parts by weight) Coating | | | |
|---|---|---|---|---|
| | Y-9 | Y-10 | Y-11 | Y-12 |
| | | Color | | |
| | Black | Red | Green | Blue |
| Acrylic resin | 750.0 | 750.0 | 750.0 | 750.0 |
| Melamine resin | 250.0 | 250.0 | 250.0 | 250.0 |
| Triethyl amine (Netralizer) | 61.8 | 61.8 | 61.8 | 61.8 |
| Carbon black | 333.0 | — | — | — |
| Phthalocyanine Blue (***) | — | — | — | 300.0 |
| Phthalocyanine Green (****) | — | — | 500.0 | — |
| Azo Metal Salt Red Pigment (*****) | — | 500.0 | — | — |

(*) Acrylic resin "ARON S-4030" (mfd. by TOAGOSE CHEMICAL INDUSTRY CO., LTD.)
(**) Melamine Resin "SUMIMAL M-66B" (mfd. by SUMITOMO CHEMICAL CO., LTD.)
(***) Phthalocyanine Blue "SR-150C" (mfd. by SANYO SHIKISO KK)
(****) Phthalocyanine Green "SAX" (mfd. by SANYO SHIKISO KK)
(*****) Metal Salt Red Pigment "PIGMENT RED 4BS" (mfd. by SANYO SHIKISO KK)

EXAMPLE 1

Using a pyrex glass substrate, 1.1 mm in thickness, having an indium-tin oxide (ITO) film, 80 nm in thickness, on its surface (master plate 1), as a cathode, and using a stainless steel beaker containing an aqueous solution of a cationic positive type photosensitive coating (X-1), as an anode, electrodeposition was carried out for 60 seconds at 25° C. at a dc voltage of 40 V. After washing the master plate 1 with ion-exchanged water followed by drying at 80° C. for 5 minutes and cooling, a non-tacky uniform coating film 2 μm in thickness was formed. A negative mask having light transmittance patterns of four different degrees of light transmittances, as shown in FIG. 2, was intimately contacted with the coating film and irradiated with UV rays of 500 mJ/cm², using a UV exposure device having a high pressure mercury lamp, manufactured by ORC MANUFACTURING CO., LTD. under the trade name of "JL-3300". On development with a 0.3 wt. % aqueous solution of sodium metasilicate, only the portions of the cationic positive type photosensitive coating film corresponding to the largest light-transmittance portions 1 of the mask were selectively removed to expose the ITO layer. After washing with water and drying, electrodeposition was carried out by applying a d.c. voltage of 50 V at 25° C. for 10 seconds was applied across the master plate 1 as a cathode and a stainless steel beaker containing a colored coating (Y-7) as an anode. After washing the master plate 1 with ion-exchanged water, followed by drying at 80° C. for 10 minutes, a black-hued colored layer, 2 μm in thickness, which was not tacky at room temperature, was produced on the master plate.

After development with a 1.3 wt. % aqueous solution of sodium metasilicate, no changes were noticed in the black-hued colored layer, while only the positive type photosensitive coating in register with the portions 4 of the second largest light-transmittance of the mask were selectively removed. After washing with water and drying, the colored coating (Y-1) was electrodeposited for 30 seconds under conditions of a d.c. voltage of 25 V and a temperature of 25° C., in the same manner as when electrodepositing the colored coating (Y-7), and the resulting substrate was washed with ion-exchanged water. It was found that there were no changes in the previously formed black-hued colored layer, and a red-hued colored layer was formed on the master plate portions freed of the coating film. After drying at 80° C. for five minutes and development with a 3.0 wt. % aqueous solution of sodium metasilicate, it was found that no changes were produced in the black-hued or red-hued colored layers, and only the positive type photosensitive coating film portions in register with the portions 3 of the third largest light-transmittance of the mask were selectively removed. After washing with water and drying, a colored coating (Y-2) was electrodeposited for 40 seconds in the same manner as for electrodepositing the colored coating (Y-7), under conditions of a d.c. voltage of 23 V and a temperature of 25° C. After washing the master plate 1 with ion-exchanged water, it was found that no changes were produced in the previously formed black-hued or red-hued colored layers, and a green-hued colored layer was formed on the master plate. After further drying at 80° C. for 10 minutes followed by irradiation of UV rays of 500 mJ/cm² onto the overall master plate 1 and then heating for 10 minutes at 150° C., development was carried out with a 0.3 wt. % aqueous solution of sodium metasilicate. Upon development, positive type photosensitive coating portions in registry with the residual portions 4 of the smallest light-transmittance of the positive mask were removed. After washing with water and drying, a colored coating (Y-3) was electrodeposited for one minute in the same manner as for electrodepositing the colored coating (Y-7), under conditions of a d.c. voltage of 20 V and a temperature of 25° C. After washing the master plate 1 with ion-exchanged water, it was found that no changes were produced in the previously formed black-hued, red-hued or green-hued colored layers, and a blue-hued colored layer was formed on the master plate 1. For completing curing, baking was carried out at 180° C. for 30 minutes to obtain a color filter excellent in transparency and uniformity and having a precise black-hued light-intercepting layer.

EXAMPLE 2

Using a pyrex glass substrate, 1.1 mm in thickness, having an indium-tin oxide (ITO) film, 80 nm in thickness, on its surface (master plate 2), as an anode, and using a stainless steel beaker containing an aqueous solution of an anionic positive type photosensitive coating (X-2), as a cathode, electrodeposition was carried out for two minutes at 25° C. at a dc voltage of 45 V. After washing the master plate 2 with ion-exchanged water followed by drying at 80° C. for 5 minutes and cooling, a non-tacky uniform coating film 2 μm in thickness was formed. A negative mask having light transmittance patterns of four different degrees of light transmittances, as shown in FIG. 2, was intimately contacted with the coating film and irradiated with UV rays of 500 mJ/cm$^2$, using a UV exposure device having a high pressure mercury lamp, manufactured by ORC MANUFACTURING CO., LTD. under the trade name of "JL-3300". After development with a 0.5 wt. % aqueous solution of sodium metasilicate, only the anionic positive type photosensitive coating film portions in register with the largest light-transmittance portion 1 of the mask were selectively removed to expose the ITO film thereat. After washing with water and drying, electrodeposition was carried out by applying a d.c. voltage of 50 V at 25° C. for 10 seconds across the master plate 2 as a cathode and a stainless steel beaker containing the black-hued colored coating (Y-7) as an anode. After washing the master plate 2 with ion-exchanged water and drying at 80° for ten minutes, a black-hued colored layer, which was not tacky at room temperature, was formed on the master plate portions freed of the coating film.

Then, after development with a 1.5 wt. % aqueous solution of sodium metasilicate, it was found that no changes were produced in the black-hued colored layer, while only the positive type photosensitive coating film portions in register with the portions 2 with the second largest light-transmittance of the mask were selectively removed. After washing with water and drying, a colored coating (Y-1) was electrodeposited for 30 seconds under conditions of the d.c. voltage of 25 V and a temperature of 25° C., in the same manner as for electrodeposition of the colored coating (Y-7). After subsequent washing with ion-exchanged water, it was found that no changes were produced in the previously formed black-hued colored layer, and a red-hued colored layer was formed on the master plate portions freed of the coating film. After drying at 80° C. for five minutes and development with a 4.0 wt. % aqueous solution of sodium metasilicate, it was found that no changes were produced in the black-hued and red-hued colored layers and only the positive type photosensitive coating portions in register with the portions 3 with the third largest light-transmittance of the mask were selectively removed. After washing with water and drying, the colored coating (Y-2) was electrodeposited for 40 seconds at a d.c. voltage of 23 V and a temperature of 25° C. in the same manner as for electrodepositing the colored coating (Y-2). After washing the master plate 2 with ion-exchanged water, it was found that no changes were produced in the previously formed black-hued or red-hued colored layers, and a green-hued colored layer was produced on the master plate portions freed of the coating film.

Then, after drying at 80° C. for five minutes, UV rays of 500 mJ/cm$^2$ were irradiated on to the overall master plate 2 followed by heating the whole master plate 2 for 10 minutes at 150° C. With development with a 0.3 wt. % aqueous solution of sodium metasilicate, positive type photosensitive coating portions in registry with the residual portions 4 of the smallest light-transmittance of the positive mask were removed. After washing with water and drying, a colored coating (Y-3) was electrodeposited for one minute in the same manner as for electrodepositing the colored coating (Y-7), under conditions of a d.c. voltage of 20 V and a temperature of 25° C. After washing the master plate 2 with ion-exchanged water, it was found that no changes were produced in the previously formed black-hued, red-hued or green-hued colored layers, and a blue-hued colored layer was formed on the master plate 1. For completing curing, baking was carried out at 180° C. for 30 minutes. A color filter having transparent and homogeneous colored layers and also having a precise black-hued light-intercepting layer was obtained.

EXAMPLE 3

Using a pyrex glass substrate, 1.1 mm in thickness, having an indium-tin oxide (ITO) film, 80 nm in thickness, on its surface (master plate 3), as a cathode, and using a stainless steel beaker containing an aqueous solution of a cationic negative type photosensitive coating (X-3), as an anode, electrodeposition was carried out For three minutes at 25° C. at a d.c. voltage of 30 V. After washing the master plate 3 with ion-exchanged water followed by drying at 80° C. for 5 minutes, cooling, and applying polyvinyl alcohol uniformly by the spin coating method to have a film thickness of 3 μm. After drying at 80° C. for ten minutes a non-tacky uniform coating film 2 μm in thickness was formed. A negative mask having light transmittance patterns of four different degrees of light transmittances, as shown in FIG. 3, was intimately contacted with the coating film and irradiated with UV rays of 500 mJ/cm$^2$, using a UV exposure device having a high pressure mercury lamp, manufactured by ORC MANUFACTURING CO., LTD. under the trade name of "JL-3300". Then, after development with a 0.05 wt. % aqueous solution of lactic acid, the cationic negative type photosensitive coating film portions in register with the portions 5 of the mask with the smallest light-transmittance were selectively removed to expose the ITO film surface thereat. After washing with water and drying, electrodeposition was carried out for 10 seconds by applying a d.c. voltage of 50 V at 25° C. across the master plate 3 as an anode and a stainless steel beaker containing a colored coating (Y-8) as a cathode. After washing the master plate 3 with ion-exchanged water and drying at 80° C. for ten minutes, a black-hued colored layer, 2 μm in thickness, non-tacky at room temperature was formed.

Then, after development with a 0.5 wt. % aqueous solution of lactic acid, no changes were noticed in the black-hued colored layer, whilst only the negative type photosensitive coating film portions in register with the portions 6 of the mask with the second smallest light-transmittance were selectively removed. After washing with water and drying, the colored coating (Y-4) was electrodeposited for 30 seconds under conditions of a d.c. voltage of 25 V and a temperature of 25° C. After washing with ion-exchanged water, it was found that no changes were produced in the previously formed black-hued colored layer, and a red-hued colored layer was formed on the master plate 3. After drying at 80° C. for five minutes and development with a 3.0 wt. % of lactic acid, it was found that no changes were produced in the black-hued or red-hued colored layers, and only the negative type photosensitive coating portions in register with the portions 7 of the mask with the third smallest light-transmittance were selectively removed. After washing with water and drying, the colored coating (Y-5) was electrodeposited for 40 seconds under conditions of a d.c. voltage of 23 V and a temparature of 25° C. in the same manner as for electrodeposition of the colored coating (Y-8). After washing the master plate 3 with ion-exchanged water, it was found that no changes were produced in the previously formed black-hued or red-hued colored layers, and a green-hued colored layer was formed on the master plate 3.

Then, after drying at 80° C. for ten minutes, and development with a 7.0 wt. % aqueous solution of lactic acid, no changes were noticed in the colored layers, and only the residual cationic negative type photosensitive coating film, that is the photosensitive coating film portions in register with the portions 8 irradiated with the largest irradiation amount, were selectively removed. After washing with water and drying, a colored coating (Y-6) was electrodeposited for one minute in the same manner as for electrodepositing the colored coating (Y-8), under conditions of a d.c. voltage of 20 V and a temperature of 25° C. After washing the master plate 3 with ion-exchanged water, it was found that no changes were produced in the previously formed black-hued, red-hued or green-hued colored layers, and a blue-hued colored layer was formed on the master plate. By baking at 170° C. for 30 minutes to complete the curing, a color filter having the colored layers and the light-intercepting layer, each 2.0 μm in thickness and showing excellent transparency and uniformity, could be obtained.

EXAMPLE 4

Using a pyrex glass substrate, 1.1 mm in thickness, having an indium-tin oxide (ITO) film, 80 nm in thickness, on its surface (master plate 4), as an anode, and using a stainless steel beaker containing an aqueous solution of an anionic negative type photosensitive coating (X-4), as a cathode, electrodeposition was carried out for three minutes at 25° C. at a d.c. voltage of 25 V. After washing the master plate 4 with ion-exchanged water followed by drying at 80° C. for 10 minutes, cooling, and applying polyvinyl alcohol uniformly by the spin coating method to have a film thickness of 3 μm. After drying at 80° C. for ten minutes, a non-tacky uniform coating film 2 μm in thickness was formed. A negative mask having light transmittance patterns of four different degrees of light transmittances, as shown in FIG. 3, was intimately contacted with the coating film and irradiated with UV rays of 600 mJ/cm$^2$, using a UV exposure device having a high pressure mercury lamp, manufactured by ORC MANUFACTURING CO., LTD. under the trade name of "JL-3300". Then, after development with a 0.1 wt. % aqueous solution of sodium carbonate, the anionic negative type photosensitive coating film portions in register with the portions 5 of the mask with the smallest light-transmittance were selectively removed to expose the ITO film surface. After washing with water and drying followed by electrodeposition at 25° C. for 10 seconds at a d.c. voltage of 50 V, with the use as a cathode of the master plate 4 and with the use as an anode of a stainless steel beaker containing a black-hued colored coating (Y-7), followed by washing the master plate 4 with ion-exchanged water and drying at 80° C. for ten minutes, a black-hued colored layer was formed on the master plate portions freed of the coating film.

Then, after development with a 0.75 wt. % aqueous solution of sodium carbonate, no changes were noticed in the black-hued colored layer, and only the negative type photosensitive coating portions in register with the portions 6 of the mask with the second smallest light-transmittance were selectively removed. After washing with water and drying, the colored coating (Y-1) was electrodeposited for 30 seconds under the conditions of a d.c. voltage of 25 V and a temperature of 25° C., in the same manner as for electrodeposition of the colored coating (Y-7). After washing with ion-exchanged water, no changes were noticed in the previously formed black-hued layer, and a red-hued colored layer was formed on the portions freed of the coating film. After drying at 80° C. for ten minutes and development with a 5.0 wt. % aqueous solution of sodium metasilicate, no changes were noticed in the black-hued or red-hued colored layers, and only the negative type photosensitive coating film portions in register with the portions 7 of the mask with the third smallest light-transmittance were selectively removed. After washing with water and drying, the colored coating (Y-2) was electrodeposited for 40 seconds under conditions of a d.c. voltage of 23 V and the temperature of 25° C., in the same manner as for electrodeposition of the colored coating (Y-7). After washing the master plate 4 with ion-exchanged water, it was found that no changes were produced in the previously formed black-hued or red-hued colored layers, and a green-hued colored layer was formed in the portions freed of the coating film.

Then, after drying at 80° C. for ten minutes, and development with a 7.0 wt. % aqueous solution of sodium metasilicate, no changes were noticed in the colored layers, and only the residual anionic negative type photosensitive coating film, that is the photosensitive coating film portions in register with the portions 8 irradiated with the largest irradiation amount, were selectively removed. After washing with water and drying, a colored coating (Y-3) was electrodeposited for one minute in the same manner as for electrodepositing the colored coating (Y-7), under conditions of a d.c. voltage of 20 V and a temperature of 25° C. After washing the master plate 4 with ion-exchanged water, it was found that no changes were produced in the previously formed black-hued, red-hued or green-hued colored layers, and a blue-hued colored layer was formed on the master plate. By baking at 170° C. for 30 minutes to complete the curing, a color filter having the colored layers and the light-intercepting layer, each 2.0 μm in thickness and showing excellent transparency and uniformity, could be obtained.

EXAMPLE 5

A positive type photoresist available under the tradename "OFPR-800" from TOKYO OHKA KOGYO KK was applied by a spin coater onto a Pyrex glass plate, 0.7 mm in thickness, having an ITO film of a film thickness of 100 nm on the glass plate followed by drying at 80° C. for 10 minutes to form a photosensitive coating film having a film thickness of 2.5 μm (hereinafter referred to as "a master plate 5").

A positive mask having four different degrees of light-transmittances was intimately contacted with the coating film and irradiated with UV rays of 70 mJ/cm$^2$ using a UV exposure device similar to Example 1. When UV rays were irradiated, 70 mJ/cm² of UV rays were irradiated to the photosensitive coating film portion corresponding to the largest light-transmittance portion of the positive mask, 56 mJ/cm² of UV rays were irradiated to the photosensitive coating film portion corresponding to the second largest light-transmittance portion of the positive mask, 17.6 mJ/cm² of UV rays were irradiated to the photosensitive coating film portion corresponding to the third largest light-transmittance portion of the positive mask, and no UV rays were irradiated to the photosensitive coating film portion corresponding to the smallest light-transmittance portion of the mask. When developing with a 2.4 wt. % aqueous solution of tetramethyl ammonium hydroxide, the positive type photosensitive coating film corresponding to the largest light-transmittance of the positive mask was removed to expose the transparent electrically conductive layer (ITO film). After washing with water and drying, electrodeposition was carried out at 25° C. for 10 seconds with a d.c. voltage of 50 V with the use of the master plate 5 as an anode and a stainless steel beaker as a cathode containing the black-hued anionic electrodeposition coating (Y-9). After washing the master plate 5 with ion-exchanged water, the master plate 5 was dried for 10 minutes at 120° C. for partial curing.

After development with a 3.5 wt. % aqueous solution of tetramethyl ammonium hydroxide, no changes were noticed in the black-hued colored layer, while only the photosensitive coating film in register with the second largest light-transmittance portion of the mask were selectively removed. After washing with water and drying, the colored coating (Y-10) was electrodeposited for 30 seconds under conditions of a d.c. voltage of 25 V and a temperature of 25° C., in the same manner as when electrodepositing the colored coating (Y-9), and the resulting plate was washed with ion-exchanged water. It was found that there were no changes in the previously formed black-hued colored layer, and a red-hued colored layer was formed on the plate portions freed of the coating film. After drying at 120° C. for 10 minutes to partially cure the colored layer, followed by development with a 2.4 wt. % aqueous solution of tetramethyl ammonium hydroxide, it was found that no changes were produced in the black-hued or red-hued colored layers, and only the photosensitive coating film portions in register with the third largest light-transmittance portion of the mask were selectively removed. After washing with water and drying, a colored coating (Y-11) was electrodeposited for 40 seconds in the same manner as for electrodepositing the black-hued colored coating (Y-9), under conditions of a d.c. voltage of 23 V and a temperature of 25° C. After washing the plate 5 with ion-exchanged water, it was found that no changes were produced in the previously formed black-hued or red-hued colored layers, and a green-hued colored layer was formed on the plate portions freed of the coating film. After drying at 120° C. for 10 minutes to partially cure the colored layer, 500 mJ/cm² of UV rays were irradiated on the overall surface of the plate 5.

After development with a 2.4 wt. % aqueous solution of tetramethyl ammonium hydroxide, the residual positive type photosensitive coating film portions in register with the smallest light transmittance portion of the mask were selectively removed. After washing with water and drying, a colored coating (Y-12) was electrodeposited for 60 seconds in the same manner as for electrodepositing the colored coating (Y-9), under conditions of a d.c. voltage of 20 V and a temperature of 25° C. After washing the plate 5 with ion-exchanged water, it was found that no changes were produced in the previously formed black-hued, red-hued or green-hued colored layers, and a blue-hued colored layer was formed on the plate portions freed of the coating film. For completing curing, the colored layers were baked at 180° C. for 30 minutes to produce a color filter having the colored layers and the light-intercepting black-hued layer excellent in transparency and homogeneity.

Although the present invention has been described with reference to the preferred examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims.

What is claimed is:

1. A method for producing a color filter comprising the steps of:
    (A) forming a photosensitive coating film on at least a transparent electrically conductive layer formed on an outermost surface of a transparent substrate and exposing said photosensitive coating film through a mask having patterns of at least three different degrees of light transmittance, said mask being selected from the group consisting of a negative mask when said photosensitive coating film is a negative film and a positive mask when said photosensitive coating film is a positive film;
    (B) developing and removing a photosensitive coating film region corresponding to a pattern selected from the group consisting of a pattern having the smallest degree of light transmittance when said mask is a negative mask and when said photosensitive coating film is a negative film and a pattern having the largest degree of light transmittance when said mask is a positive mask and when said photosensitive coating film is a positive film for exposing said transparent electrically conductive layer and electrodepositing a colored coating on the exposed transparent electrically conductive layer for forming a colored layer thereon, the operation of developing and removing the photosensitive coating film and electrodepositing the colored coating being sequentially repeated for the respective patterns having different degrees of light transmittance where said sequence of repetition is selected from the group consisting of increasing light transmittance when said mask is a negative mask and when said photosensitive coating film is a negative film and decreasing light transmittance when said mask is a positive mask and when said photosensitive coating film is a positive film to form different colored layers, respectively, said electrodepositing being in turn performed each time at a decreasing voltage.

2. A method as claimed in claim 1 wherein a material of said transparent electrically conductive layer is selected from the group consisting of tin oxide, indium oxide, antimony oxide and mixtures thereof.

3. A method as claimed in claim 1 wherein said photosensitive coating film is formed by a method selected from the group consisting of electrodeposition, spraying, dip coating, roll coating, screen printing and spin coating.

4. A method as claimed in claim 1 wherein said photosensitive coating film is formed of a negative photosensitive coating containing a negative photosensitive coating resin exhibiting coating film forming capability and photosensitivity, a photopolymerization initiator and a solvent selected from the group consisting of an organic solvent and water.

5. A method as claimed in claim 4 wherein said negative photosensitive coating resin has a molecular weight ranging between 500 and 10,000.

6. A method as claimed in claim 4 wherein said negative photosensitive coating resin is a prepolymer formed from a monomer selected from the group consisting of epoxy (meth)acrylate, urethane (meth)acrylate, polyester (meth)acrylate and mixtures thereof.

7. A method as claimed in claim 4 wherein said negative photosensitive coating resin is an onium group-containing cationic resin prepared by introducing an onium group and a photosensitive group into a main resin and neutralizing with an acidic material, said main resin being selected from the group consisting of acrylic resin, polyester resin, maleinated oil resin, epoxy resin, urethane resin, polybutadiene resin, polyamide resin and mixtures thereof, said onium group being selected from the group consisting of an amino group, an ammonium group, a sulfonium group and mixtures thereof, said photosensitive group being selected from the group consisting of an acryloyl group, a methacryloyl group, a cinnamoyl group and mixtures thereof, and said acidic material being selected from the group consisting of formic acid, acetic acid, propionic acid, lactic acid and mixtures thereof.

8. A method as claimed in claim 4 whrerein said negative photosensitive coating resin is a carboxyl group-containing anionic resin obtained by introducing a carboxyl group and a photosensitive group into a main resin and neutralizing with a basic substance, said main resin being selected from the group consisting of acrylic resin, polyester resin, maleinated oil resin, polybutadiene resin, epoxy resin, urethane resin, polyamide resin and mixtures thereof, said photosensitive group being selected from the group consisting of an acryloyl group, a methacryloyl group, a cinnamoyl group and mixtures thereof, said basic substance being selected from the group consisting of triethylamine, diethylamine, dimethylethanol amine, ammonia and mixtures thereof.

9. A method as claimed in claim 4 wherein said photopolymerization initiator is selected from the group consisting of benzoins, benzoin ethers, benzilalkyl ketals, benzophenone, anthraquinone, thioxanthone and mixtures thereof.

10. A method as claimed in claim 4 wherein an added amount of said photopolymerization initiator is 0.1 to 30 parts by weight to 100 parts by weight of said negative photosensitive coating resin.

11. A method as claimed in claim 4 wherein said organic solvent is selected from the group consisting of ethyleneglycol monobutyl ether, ethyleneglycol monohexyl ether, ethyleneglycol monophenyl ether, propyleneglycol monomethyl ether, propylneglycol monophenyl ether, diethyleneglycol dimethyl ether, triethyleneglycol dimethyl ether, acetone, methylethyl ketone, methylisobutyl ketone, cyclohexanone, isophorone, dibutyl ether, dioxane, tetrahydrofuran, methoxy butanol, diacetone alcohol, butanol, isopropanol, toluene, xylene, hexane, ethyl acetate, butyl acetate, 2-methoxyethyl acetate, 2-methoxypropyl acetate, ethyl benzoate, dimethyl formamide, N,N-dimethyl acetoamide, dimethyl sulfoxide and mixtures thereof.

12. A method as claimed in claim 4 wherein said negative photosensitive coating contains a colorant selected from the group consisting of dyes, pigments and mixtures thereof.

13. A method as claimed in claim 12 wherein said dye is selected from the group consisting of azo dyes, anthraquinone dyes, benzodifuranone dyes, condensed methine dyes and mixtures thereof.

14. A method as claimed in claim 12 wherein said pigment is selected from the group consisting of azo lake organic pigments, quinacridone organic pigments, phthalocyanine organic pigments, isoindolinone organic pigments, anthraquinone organic pigments, thioindigo organic pigments, chrome yellow, iron oxide, chrome vermilion, chrome green, ultramarine, prussian blue, cobalt blue, cobalt green, emerald green, titanium white, carbon black and mixtures thereof.

15. A method as claimed in claim 12 wherein said colorant is used in an amount of 0.1 to 10 wt. % based on a total amount of the negative type photosensitive coating.

16. A method as claimed in claim 1 wherein said photosensitive coating film is formed of a positive photosensitive coating containing a positive photosensitive coating resin having coating film forming capability and photosensitivity and a solvent selected from the group consisting of an organic solvent and water.

17. A method as claimed in claim 16 wherein said positive photosensitive coating resin is a quinone diazido group-containing cationic resin obtained by introducing an onium group and a hydroxyl group into a main resin, adding a quinone diazido sulfonic acid compound by esterification reaction and neutralization with an acidic material, said main resin being selected from the group consisting of acrylic resin, polyester resin, maleinated oil resin, epoxy resin, urethane resin, polybutadiene resin, polyamide resin and mixtures thereof, said onium group being selected from the group consisting of an amino group, an ammonium group, a sulfonium group and mixtures thereof, and said acidic material being selected from the group consisting of formic acid, acetic acid, propionic acid, lactic acid and mixtures thereof.

18. A method as claimed in claim 16 wherein said positive photosensitive coating resin is a quinone diazido group-containing anionic resin obtained by introducing a carboxyl group and a hydroxyl group into a main resin, adding a quinone diazido sulfonic acid compound by esterification reaction and neutralization with a basic substance, said main resin being selected from the group consisting of acrylic resin, polyester resin, maleinated oil resin, polybutadiene resin, epoxy resin, urethane resin, polyamide resin and mixtures thereof, and said basic substance being selected from the group consisting of triethylamine, diethylamine, dimethylethanol amine, ammonia and mixtures thereof.

19. A method as claimed in claim 16 wherein said positive photosensitive coating resin is a quinone diazido group-containing resin obtained by reacting a resin having film forming capability and a hydroxyl group-containing compound with a quinone diazido compound, said quinone diazido compound being selected from the group consisting of a quinone diazido sulfonic acid derivative-containing quinone diazido compound and an isocyanate group-containing quinone azido compound.

20. A method as claimed in claim 16 wherein said organic solvent is selected from the group consisting of ethyleneglycol monobutyl ether, ethylglycol monohexyl ether, ethyleneglycol monophenyl ether, propyleneglycol monomethyl ether, propyleneglycol monophenyl ether, diethyleneglycol dimethyl ether, triethyleneglycol dimethyl ether, acetone, methylethyl ketone, methylisobutyl ketone, cyclohexanone, isophorone, dibutyl ether, dioxane, tetrahydrofuran, methoxy butanol, diacetone alcohol, butanol, isopropanol, toluene, xylene, hexane, ethyl acetate, butyl acetate, 2-methoxyethyl acetate, 2-methoxypropyl acetate, ethyl benzoate, dimethylformamide, N,N-dimethyl acetoamide, dimethyl sulfoxide and mixtures thereof.

21. A method as claimed in claim 16 wherein said positive photosensitive coating contains a colorant selected from the group consisting of dyes, pigments and mixtures thereof.

22. A method as claimed in claim 21 wherein said dye is selected from the group consisting of azo dyes, anthraquinone dyes, benzodifuranone dyes, condensed methine dyes and mixtures thereof.

23. A method as claimed in claim 21 wherein said pigment is selected from the group consisting of azo lake organic pigments, quinacridone organic pigments, phthalocyanine organic pigments, isoindolinone organic pigments, anthraquinone organic pigments, thioindigo organic pigments, chrome yellow, iron oxide, chrome vermilion, chrome green, ultramarine, prussian blue, cobalt blue, cobalt green, emerald green, titanium white, carbon black and mixtures thereof.

24. A method as claimed in claim 21 wherein 0.1 to 10 wt. % of said colorant is contained based on total weight of said positive photosensitive coating.

25. A method as claimed in claim 1 wherein said photosensitive coating film is developed and removed by a developing solution selected from the group consisting of an aqueous solution containing an acidic material dissolved therein, an aqueous solution containing a basic material dissolved therein, alcohols, glycol ethers, ketones and chlorinated hydrocarbons.

26. A method as claimed in claim 25 wherein said acidic material is selected from the group consisting of formic acid, acetic acid, propionic acid, lactic acid, hydrochloric acid, phosphoric acid and mixtures thereof.

27. A method as claimed in claim 25 wherein said basic material is selected from the group consisting of sodium carbonate, sodium hydrogen carbonate, sodium metasilicate, tetraalkyl ammonium hydroxides sodium hydroxide, potassium hydroxide and mixtures thereof.

28. A method as claimed in claim 1 wherein said photosensitive coating film is developed and removed under conditions of a temperature of 10° to 70° C. and a developing time of 2 to 600 seconds.

29. A method as claimed in claim 1 wherein said colored coating is obtained by neutralizing a film-forming component and a colorant component with a material selected from the group consisting of an acidic substance and a basic substance, said film-forming component being selected from the group consisting of cationic resins, anionic resins and photocurable resins, said colorant component being selected from the group consisting of dyes, pigments and mixtures thereof, said acidic substance being selected from the group consisting of formic acid, acetic acid, propionic acid, lactic acid and mixtures thereof, and said basic substance being selected from the group consisting of triethylamine, diethylamine, diethylethanol amine, ammonia and mixtures thereof.

30. A method as claimed in claim 29 wherein said cationic resin is obtained by introducing an onium group into a main resin, said main resin being selected from the group consisting of acrylic resin, polyester resin, maleinated oil resin, epoxy resin, urethane resin, polybutadiene resin, polyamide resin and mixtures thereof, and said onium group being selected from the group consisting of an amino group, an ammonium group, a sulfonium group and mixtures thereof.

31. A method as claimed in claim 29 wherein said anionic resin is obtained by introducing a carboxyl group into a main resin selected from the group consisting of acrylic resin, polyester resin, maleinated oil resin, polybutadiene resin, epoxy resin, urethane resin, polyamide resin and mixtures thereof.

32. A method as claimed in claim 29 wherein said photocurable resin contains a functional group selected from the group consisting of an acryloyl group, a methacryloyl group, a cinnamoyl group and mixtures thereof in a molecule thereof.

33. A method as claimed in claim 29 wherein said photocurable resin comprises a photopolymerization initiator selected from the group consisting of benzoins, benzoin ethers, benzilalkyl ketals, benzophenone, anthraquinone, thioxanthone and mixtures thereof.

34. A method as claime in claim 29 wherein said dye is selected from the group consisting of azo dyes, anthraquinone dyes, benzodifuranone dyes, condensed methine dyes and mixtures thereof.

35. A method as claimed in claim 29 wherein said pigment is selected from the group consisting of azo lake organic pigments, quinacridone organic pigments, phthalocyanine organic pigments, isoindolinone organic pigments, anthraquinone organic pigments, thioindigo organic pigments, chrome yellow, iron oxide, chrome vermilion, chrome green, ultramarine, prussian blue, cobalt blue, cobalt green, emerald green, titanium white, carbon black and mixtures thereof.

36. A method as claimed in claim 1 wherein said colored coating is electrodeposited at an electrical voltage of 5 to 500 V dc for a time interval of 5 to 300 seconds and at a liquid temperature of 10° to 35° C.

37. A method as claimed in claim 1 further comprising a step of curing said colored layers by heating at 100° to 250° C. for 5 minutes to one hour after said step (B) is performed.

38. A method as claimed in claim 1 further comprising a step of photocuring said colored layers after said step (B) is performed.

39. A method as claimed in claim 1 wherein a voltage of said electrodepositing is 40 to 98% that of electrodepositing of the colored layer formed immediately before.

40. A method as claimed in claim 1 wherein when a black-hued colored layer is first electrodeposited during said electrodepositing the colored layer, a voltage at a second and subsequent electrodeposition is 40 to 80% that of the first electrodeposition.

41. A method as claimed in claim 1 wherein a sweep time for setting a voltage during said electrodepositing is 2 seconds or more.

* * * * *